US009927082B2

(12) United States Patent
Bauer et al.

(10) Patent No.: US 9,927,082 B2
(45) Date of Patent: Mar. 27, 2018

(54) METHOD FOR PRODUCING A HEADLIGHT ASSEMBLY

(71) Applicant: ZIZALA LICHTSYSTEME GMBH, Wieselburg (AT)

(72) Inventors: Friedrich Bauer, Bergland (AT); Martin Biesenberger, Persenbeug (AT)

(73) Assignee: ZKW GROUP GMBH, Wieselburg an der Erlauf (AT)

( * ) Notice: Subject to any disclaimer, the term of this patent is extended or adjusted under 35 U.S.C. 154(b) by 96 days.

(21) Appl. No.: 14/765,263

(22) PCT Filed: Jan. 7, 2014

(86) PCT No.: PCT/AT2014/050001
§ 371 (c)(1),
(2) Date: Jul. 31, 2015

(87) PCT Pub. No.: WO2014/121312
PCT Pub. Date: Aug. 14, 2014

(65) Prior Publication Data
US 2015/0369435 A1    Dec. 24, 2015

(30) Foreign Application Priority Data

Feb. 7, 2013    (AT) ........................................ 98/2013

(51) Int. Cl.
*F21S 8/10*    (2006.01)
*H05K 1/02*    (2006.01)
(Continued)

(52) U.S. Cl.
CPC ......... *F21S 48/1104* (2013.01); *F21S 48/115* (2013.01); *F21S 48/1159* (2013.01);
(Continued)

(58) Field of Classification Search
CPC .. F21S 48/1104; F21S 48/115; F21S 48/1159; F21S 48/1305; F21S 48/328; H05K 1/0295
See application file for complete search history.

(56) References Cited

U.S. PATENT DOCUMENTS

| 2009/0046466 | A1* | 2/2009 | Yang | ................... F21V 19/0035 362/294 |
| 2014/0098517 | A1* | 4/2014 | Chen | ................... F21S 48/1159 362/36 |

FOREIGN PATENT DOCUMENTS

| JP | 2009-259834 A | 11/2009 |
| JP | 2009-272307 A | 11/2009 |

(Continued)

OTHER PUBLICATIONS

Office Action issued in Japanese Application No. 2015-556336, dated Aug. 16, 2016 (3 pages).

*Primary Examiner* — Andrew Coughlin
*Assistant Examiner* — Nathaniel Lee
(74) *Attorney, Agent, or Firm* — Eversheds Sutherland (US) LLP

(57) ABSTRACT

The invention relates to a method for producing a lighting unit of a vehicle headlight, comprising the following steps: provision of a printed circuit board (1) comprising a plurality of groups (A, B, C) of contact pads (2) for contacting LEDs (3), population of contact pads (2) in the groups (A, B, C) with LEDs (3), wherein the contact pads (2) to be populated are selected according to a desired light function of the respective group (A, B, C), and provision of securing means (A", B", C") for reflectors (A', B', C') on the printed circuit board (1), wherein each securing means (A", B", C") is specifically designed for a reflector (A', B', C') that is adapted to the light function of the respective group (A, B, C).

5 Claims, 2 Drawing Sheets

Figure 1:
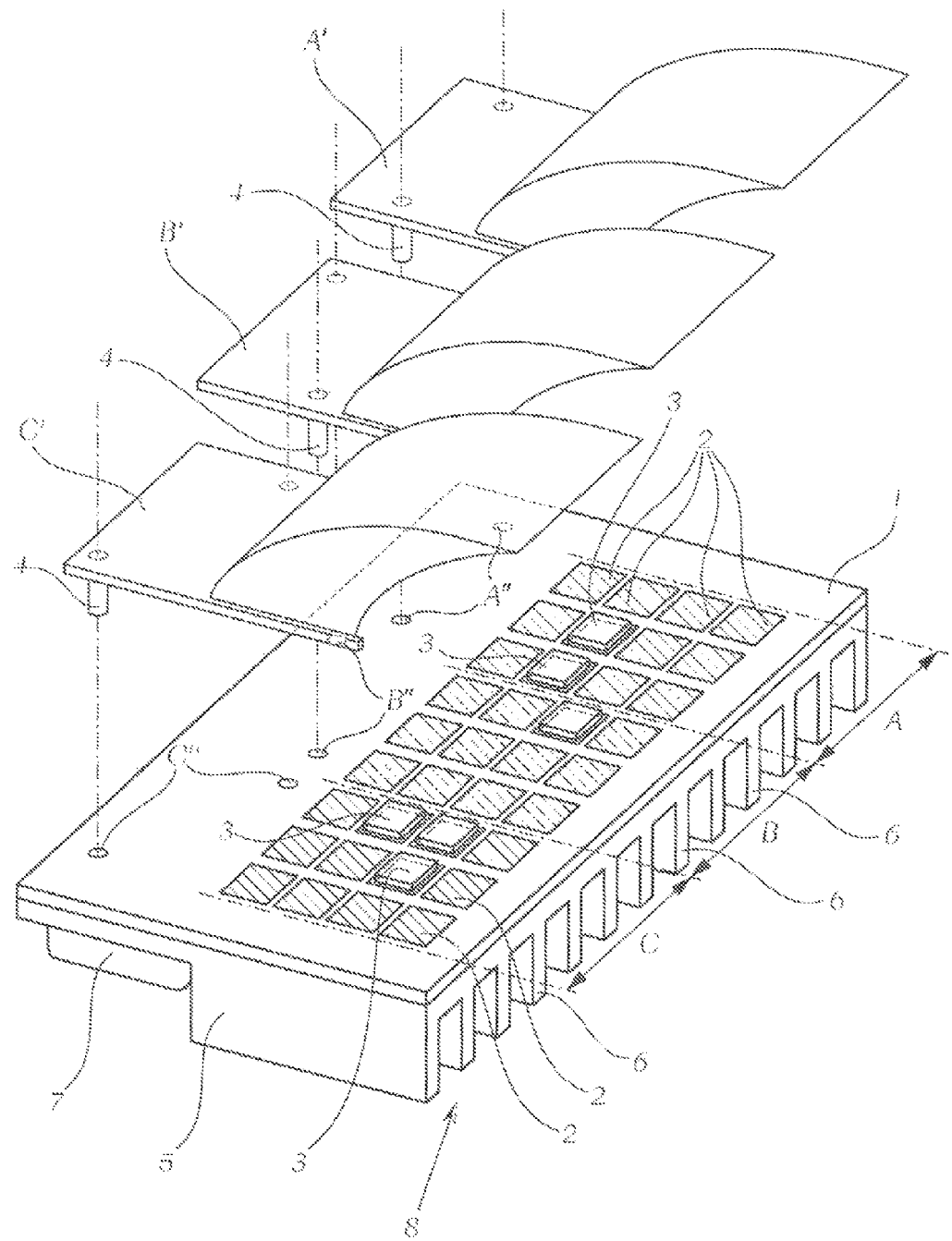

(51) Int. Cl.
 H05K 3/30 (2006.01)
 H05K 1/11 (2006.01)
 H05K 3/00 (2006.01)

(52) U.S. Cl.
 CPC ......... F21S 48/1305 (2013.01); F21S 48/328 (2013.01); H05K 1/0295 (2013.01); H05K 1/111 (2013.01); H05K 3/0061 (2013.01); H05K 2201/10106 (2013.01); H05K 2201/10121 (2013.01); Y10T 29/49131 (2015.01)

(56) References Cited

FOREIGN PATENT DOCUMENTS

| | | |
|---|---|---|
| JP | 2010-182486 A | 8/2010 |
| JP | 2010-186699 A | 8/2010 |
| JP | 2013-020935 A | 1/2013 |

* cited by examiner

METHOD FOR PRODUCING A HEADLIGHT ASSEMBLY

The invention relates to a method for producing a lighting unit of a vehicle headlight and also to a lighting unit produced by this method.

Modern vehicle headlights not only provide different complex and powerful light functions, but also are increasingly integrated into the design of the respective vehicles and are optimised in view of the aerodynamic drag of the vehicle and also in view of safety-relevant aspects, such as pedestrian protection. However, these properties and functions of modern vehicle headlights, which are desirable per se, are accompanied by difficulties with regard to the standardisation of the corresponding components, and it is therefore increasingly difficult to achieve larger numbers of the components and therefore to achieve scale effects in terms of cost. This is disadvantageous in particular for vehicles in the mid-to-low price ranges.

The object of the present invention is therefore to specify a method for producing a lighting unit of a vehicle headlight, which with use of standardised components allows the greatest possible flexibility in view of the light functions that can be produced with these components, wherein the headlight assemblies and the corresponding components will be able to be assembled in a simple and error-free manner.

In order to achieve this object a method of the type mentioned in the introduction is characterised in accordance with the present invention by the following steps:
  provision of a printed circuit board comprising a plurality of groups of contact pads for contacting LEDs,
  population of contact pads in the groups with LEDs, wherein the contact pads to be populated are selected according to a desired light function of the respective group, and
  provision of securing means for reflectors on the printed circuit board, wherein each securing means is specifically designed for a reflector that is adapted to the light function of the respective group.

The present invention thus makes it possible to produce a large number of printed circuit boards irrespective of the light functions of future headlights to be attained with the invention, wherein these printed circuit boards have a plurality of contact pads in identical groups. Depending on which light functions are to be provided with these standardised printed circuit boards for the headlights of a vehicle, selected contact pads are populated with LEDs, wherein in the normal case each group of contact pads is associated with a light function, for example daytime running beam, dipped beam, full beam. In order to now ensure not only the increased flexibility with use of a standardised printed circuit board in accordance with the above-stated object of the invention, it is provided as a further step of the method according to the invention that securing means for the reflectors adapted to the respective light functions of the individual groups are provided on the standardised printed circuit board, wherein the securing means, on account of their geometry, are specifically designed for the reflectors adapted to the light function of the respective group. This means that the reflectors used in the method according to the invention have specific counterpieces to the securing means in accordance with their adaptation to the respective light functions so as to ensure error-free assembly of the lighting unit according to the present invention.

It is therefore possible with the present invention to produce standardised printed circuit boards comprising a plurality of contact pads for different light functions, wherein, at the time of manufacture, only those contact pads in which individual groups which are necessary for the respective light function are populated with LEDs and securing means specifically designed, i.e. coding, for reflectors suitable for the light function are provided, such that, even with an economical mass production of vehicle headlights, faulty pairings of LEDs and reflector can be ruled out. The invention also makes it possible to produce both left and right headlights using identical printed circuit boards. Left and right headlights of a vehicle are generally not constructed simply in a mirror-inverted manner, since most vendor parts are not obtainable in mirror image, and therefore a corresponding configuration of the projected light is necessary.

In accordance with a preferred embodiment of the present invention the securing means are formed as bores in the printed circuit board, which bores are suitable for co-operating with corresponding fixing pins on the reflectors. This constitutes a particularly simple supplementation of the present invention, since the formation of simple bores in a printed circuit board is possible with little outlay and at the same time a unique coding of the securing means to the fixing pins on the reflectors is made possible.

It is known to a person skilled in the art that, when populating contact pads with LEDs, certain manufacturing tolerances occur with regard to the exact position and have to be compensated for precisely by means of corresponding alignment of the respective reflectors relative to the light sources or LEDs. The method according to the invention is therefore developed further in accordance with a preferred embodiment in that the position of the securing means relative to the respective group is determined on the basis of the positions of the LEDs following the population. Thus, only once the contact pads have been populated with the LEDs is the exact position thereof determined and only then are the securing means for the reflectors placed on the basis of these positions.

In accordance with a preferred embodiment of the present invention the printed circuit board is secured to a support having a heat sink and control electronics for the LEDs. The resultant module can be delivered to the respective production plants in a space-saving manner, whereupon the final assembly of the reflectors and subsequently of the vehicle headlight can be performed.

The lighting unit according to the invention is produced in accordance with the method just described and is characterised by particularly low production costs.

A particularly flexible and therefore preferred lighting unit is obtained in conjunction with the present invention when the contact pads of the groups can be actuated individually. In addition to the flexibility with regard to the population, the projected light can thus be influenced additionally by selective switching on and switching off of individual LEDs, without the printed circuit board itself having to be changed accordingly.

Figure 2:
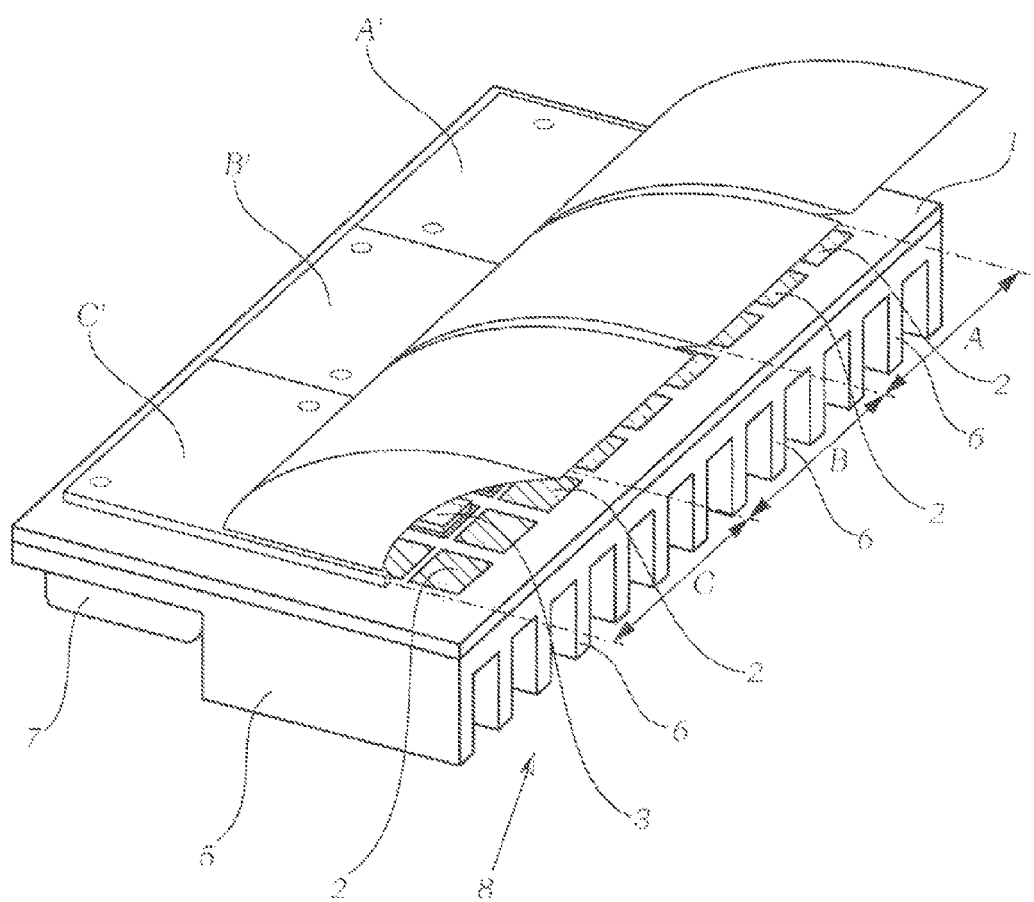

The invention will be explained in greater detail hereinafter on the basis of an exemplary embodiment illustrated schematically in the drawings, in which:

FIG. 1 shows a perspective view of the printed circuit board used in the method according to the invention with support and reflectors, wherein the reflectors are not fitted on the printed circuit board, and FIG. 2 shows a view according to FIG. 1 with fitted reflectors.

In FIG. 1 reference sign 1 designates a printed circuit board, which has three identical groups A, B and C of contact pads 2. As can be clearly seen in FIG. 1, the contact pads 2 of the individual groups A, B and C can be populated differently with LEDs 3, wherein for example a daylight function can be produced in group B, a dipped beam function can be produced in group A, and a main beam function can be produced in group C. Reflectors A', B' and C' adapted to these specific light functions also have to be installed in accordance with the different populations of the LEDs in the individual groups A, B and C and the different light functions associated therewith. In order to rule out confusions here, as described above, securing means A", B" and C" are then provided on the printed circuit board 1 for reflectors A', B' and C', which securing means correspond in terms of their geometry and/or their arrangement to the geometry and/or arrangement of the fixing pins 4 of the reflectors A', B' and C', such that, for example, the reflector C' can be inserted only into the securing means C", which in the present case are formed as bores. A false pairing between the type of population of the LEDs 3 in group C on the printed circuit board 1 and the reflector is thus reliably avoided. Reference sign 5 designates a support on which the printed circuit board 1 is secured. The support 5 has a heat sink 8 in the form of a set of cooling fins 6 and also has control electronics 7 (not illustrated in greater detail) for the LEDs 3. It can now be seen in FIG. 2 that the reflectors A', B' and C' are inserted into the securing means A", B" and C" and can thus accordingly bundle and guide the light irradiated by the LEDs 3. A lighting unit of a vehicle headlight can thus be produced on a standardised printed circuit board 1, wherein an increased flexibility in view of the light functions is provided and at the same time errors when attaching the reflectors necessary for the respective light functions can be avoided.

The invention claimed is:

1. A method for producing a lighting unit of a vehicle headlight, the method comprising:
    providing a printed circuit board comprising groups of contact pads, each group comprising a plurality of contact pads for contacting LEDs,
    populating one or more of the contact pads in each of the groups of contact pads with LEDs to produce a different desired light function for each of the groups of contact pads, and
    providing, following the populating of the one or more contact pads in each of the groups of contact pads with LEDs and based on a position of the LEDs in each of the groups of contact pads, securing means for reflectors on the printed circuit board, wherein each securing means is specifically designed for a reflector that corresponds to the desired light function of the respective group of contact pads.

2. The method according to claim 1, wherein the securing means comprise bores in the printed circuit board, which cooperate with corresponding fixing pins on the reflectors.

3. The method according to claim 1, wherein the printed circuit board is secured to a support having a heat sink and control electronics for the LEDs.

4. The method according to claim 1, wherein the desired light function comprises a daytime running beam, a dipped beam, or a full beam.

5. A method for producing a lighting unit of a vehicle headlight, the method comprising the following steps in order:
    providing a printed circuit board comprising groups of contact pads, each group comprising a plurality of contact pads for contacting LEDs,
    populating some but not all of the contact pads in each of the groups of contact pads with LEDs to produce a different desired light function for each of the groups of contact pads, and
    providing, following the populating of the one or more contact pads in each of the groups of contact pads with LEDs and based on a position of the LEDs in each of the groups of contact pads, bores in the printed circuit board for attachment of reflectors on the printed circuit board, wherein each of the bores is specifically designed for fixing pins of a reflector that corresponds to the desired light function of the respective group of contact pads.

* * * * *